United States Patent [19]
Harley

[11] Patent Number: 5,774,473
[45] Date of Patent: Jun. 30, 1998

[54] SCAN LATCH AND TEST METHOD THEREFORE

[75] Inventor: Andrew Harley, Patchway, United Kingdom

[73] Assignee: SGS-Thomson Microelectronics Limited, Bristol, United Kingdom

[21] Appl. No.: 558,595

[22] Filed: Oct. 30, 1995

[30] Foreign Application Priority Data

Oct. 31, 1994 [GB] United Kingdom .................. 9421977

[51] Int. Cl.$^6$ .................................................... G06F 11/00
[52] U.S. Cl. .................................... 371/22.3; 395/183.06
[58] Field of Search ................................. 371/22.3, 22.5, 371/22.6, 25.1; 395/183.06

[56] References Cited

U.S. PATENT DOCUMENTS

| 4,742,293 | 5/1988 | Koo et al. ................................... 324/73 |
| 5,015,875 | 5/1991 | Giles et al. .......................... 307/272.2 |

FOREIGN PATENT DOCUMENTS

| A-0 145 866 | 6/1985 | European Pat. Off. ........ G06F 11/26 |
| A-0 444 845 | 9/1991 | European Pat. Off. ........ G01R 31/28 |

OTHER PUBLICATIONS

Standard Search report issued by the European Patent Office Dec. 15, 1994.
IBM Technical Disclosure Bulletin, vol. 33, No. 10A, Mar. 1991, New York US, pp. 112–113, "Four–To–One LSSD Converter".
IBM Technical Disclosure Bulletin, vol. 32, No. 4B, Sep. 1989, New York US pp. 325–330, "Register File With System Logout".

*Primary Examiner*—Vincent P. Canney
*Attorney, Agent, or Firm*—Wolf, Greenfield & Sacks, P.C.; James H. Morris

[57] ABSTRACT

A scan latch comprises a plurality of capture half-latches connected in parallel between an input node and an intermediate node and a release half-latch connected between the intermediate node and a scan output node, each capture half-latch having a control terminal, a capture select terminal and a release select terminal. The control terminals receive a common timing control signal. The capture select terminals receive respective capture select signals for controlling the capture of data inputted to the scan latch. The release select terminals receive respective release select signals for controlling the release of data from the capture half-latches. The scan latch also comprises a control circuit for generating release select signals and capture select signals for selectively controlling the capture half-latches in a normal functional mode of operation. There is also test control circuitry for generating release select signals and capture select signals for selectively enabling the capture half-latches in a test mode. The test control circuitry has a test controller for supplying a sequence of test data bits to the scan latch under the control of the timing control signal, and addressing circuitry for simultaneously addressing both the capture select terminal and release select terminal of each capture half-latch in turn, wherein each capture half-latch can be tested successively.

27 Claims, 7 Drawing Sheets

SCAN LATCH AND TEST METHOD THEREFORE

FIELD OF THE INVENTION

The present invention relates to a scan latch and test method for a scan latch.

BACKGROUND OF THE INVENTION

Scan testing is a well established technique for checking the functionality of logic circuits, and boundary scan testing is also a well-established technique for checking the interconnections between integrated circuits. A brief explanation of scan testing techniques follows by way of background to the invention. The following description includes a description of a novel scan testing technique described in our copending application No. (Page White & Farrer Ref. 79209) and is therefore not to be taken as an acknowledgement of prior art.

Figure 1:
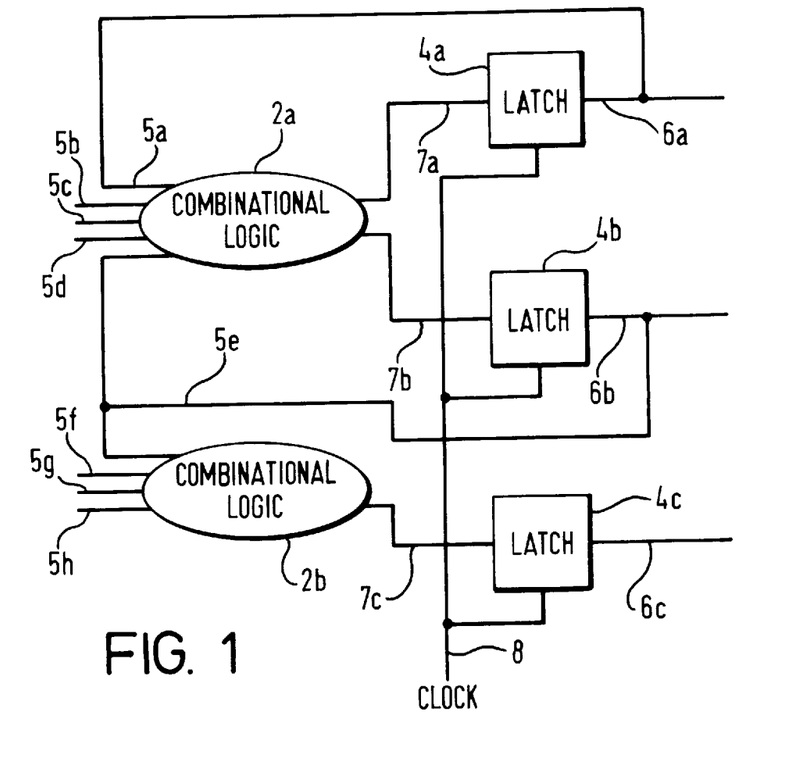
FIG. 1 is a block diagram of a functional logic structure.

FIG. 1 illustrates schematically the structure of part of a functional logic circuit. The functional logic circuit can be considered to consist of blocks of combinational logic 2a, 2b connected to clocked memory elements or latches 4a, 4b, 4c. The combinational logic blocks represent purely combinational logic, that is where the output depends only on an extant set of inputs with no clocked circuits. The latch 4a receives as its data input an output on line 7a from the combinational logic block 2a, and generates its output on line 6a. The latch 4b receives as its data input another input on line 7b from the combinational logic block 2a, and generates its output on line 6b. The latch 4c receives as its data input an output on line 7c from the combinational logic block 2b, and generates its output on line 6c. The combinational logic block 2a receives a plurality of data inputs 5a to 5e. The data input 5a is taken from the output line 6a and the data input 5e is taken from the output line 6b. The combinational logic block 2b receives a plurality of inputs 5e, 5f, 5g and 5h. It will be understood that the structure of FIG. 1 is given only by means of an illustrative example and the combinational logic blocks 2a and 2b may in practice have a much larger number of inputs. It will also be understood that in the example of FIG. 1 additional combinational logic blocks and latches do in practice exist. The latches 4a, 4b and 4c are clocked by a common clock signal CLOCK connected to the respective latches by means of a common clock signal line 8.

Figure 2:
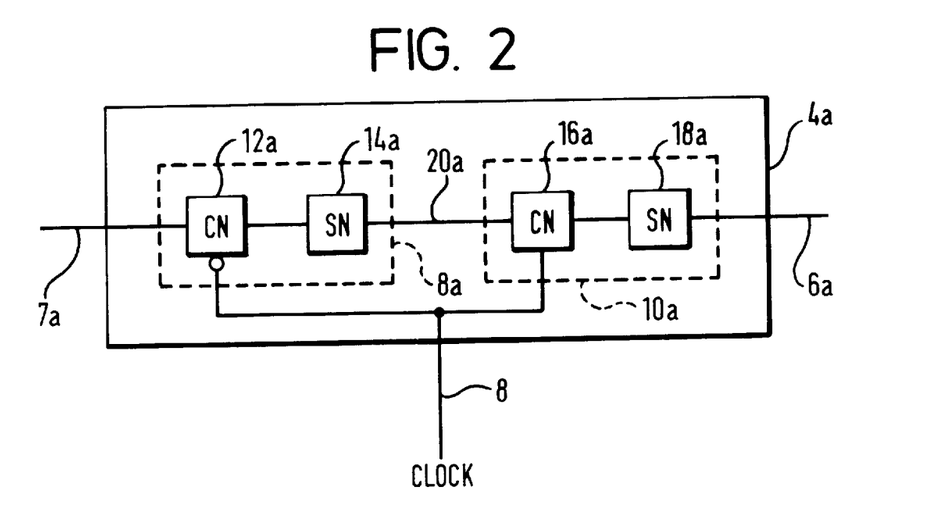
FIG. 2 illustrates an example of an embodiment of a synchronous scan latch using half-latches.

Referring now to FIG. 2, an implementation of the latch 4a of FIG. 1 is shown. The latch 4a may consist of two half-latches, or transparent latches, 8a and 10a. Each half-latch consists of a respective control node (CN) 12a, 16a and a respective storage node (SN) 14a, 18a. The clock signal CLOCK on line 8 clocks the control node 16a of half-latch 10a whilst the inverse of the clock signal CLOCK, NOTCLOCK, clocks the control node 12a. It will be understood, as is well known in the art, that the clock signals CLOCK and NOTCLOCK could be non-overlapping clock signals, or alternatively circuitry in the control nodes 12a and 16a could take account of any possible overlap of the two clocks. The latches 4b and 4c of FIG. 1 similarly comprise two half-latches.

The term half-latch is used herein to denote circuitry which acts in a data transfer state to transmit a signal from its input node to its output node with the control signal in a first state and in a data holding state to store the signal on the output node with the control signal in the second state. A simple implementation of a half-latch is an FET transister having its source/drain channel connected between the input node and the output node and its gate connected to receive the control signal. There is sufficient capacitance inherent in the transistor to provide the storage requirement at the output node. However, the storage capacity can be improved by providing an extra storage element. Other implementations of a half-latch are known and any suitable implementation can be used in the circuit of this invention.

Figure 3:
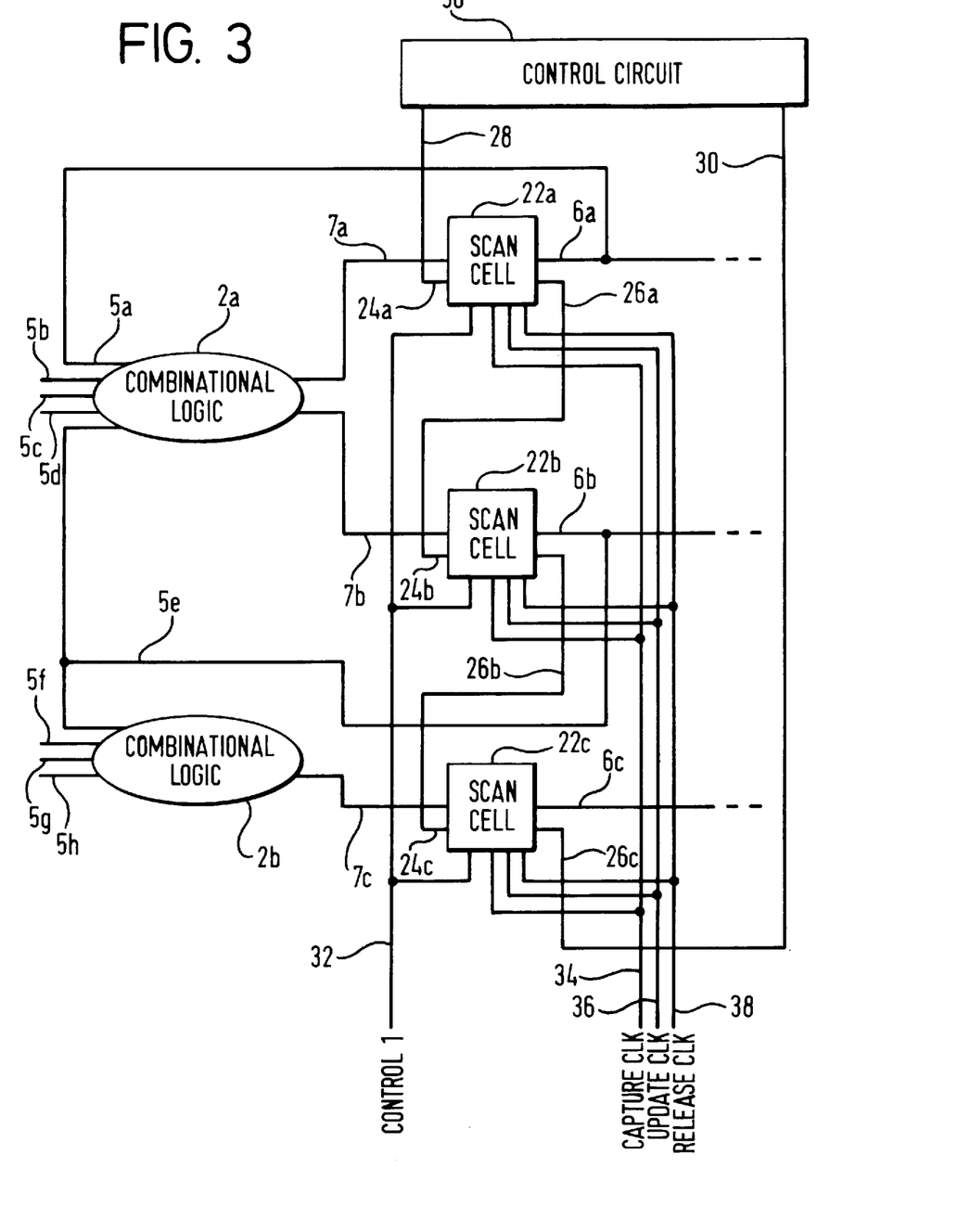
FIG. 3 is a block diagram of the functional logic structure of FIG. 1 adopted to include scan cells for performing scan testing.

It is desirable to test the structure of the combinational logic blocks placed between memory elements to ensure they function correctly. To do this it is necessary to put known test bits on the inputs of the combinational logic blocks and then check that the results generated at the outputs of the combinational logic blocks are those expected for the given test bits on the inputs. Such a test can be efficiently performed with a scan test. This is achieved by replacing each of the latches 4a, 4b and 4c in the functional logic circuitry of FIG. 1 with a respective scan cell 22a, 22b and 22c as is shown in FIG. 3. In FIG. 3, like reference numerals have been used for components and connections which are common to FIGS. 1 and 2.

Referring to FIG. 3, each of the scan cells 22a, 22b, 22c receives as a data input the outputs on the lines 7a, 7b, 7c respectively and generate their data outputs on the lines 6a, 6b, 6c respectively. In addition the scan cell 22a receives a scan input on line 24a from an output line 28 of a controller 56 and generates a scan output on line 26a, the scan cell 22b receives a scan input on line 24b from the output line 26a and generates a scan output on line 26b, and the scan cell 22c receives a scan input on line 24c from the output line 26b and generates a scan output on line 26c. The scan output 26c of the scan cell 22c forms an input to the control circuit 56 on line 30. Each scan cell 22a, 22b, 22c receives a common control signal CONTROL1 on line 32 and three clock signals: CAPTURECLK, UPDATECLK and RELEASECLK on lines 34, 36 and 38 respectively. The controller generates the three clock signals CAPTURECLK, RELEASECLK and UPDATECLK from a master clock signal. If the scan test being performed is compatible with IEEE Standard 1149.1-1990 then the controller 56 may be a Test Access Port (TAP) controller as defined by that IEEE Standard.

Figure 4:
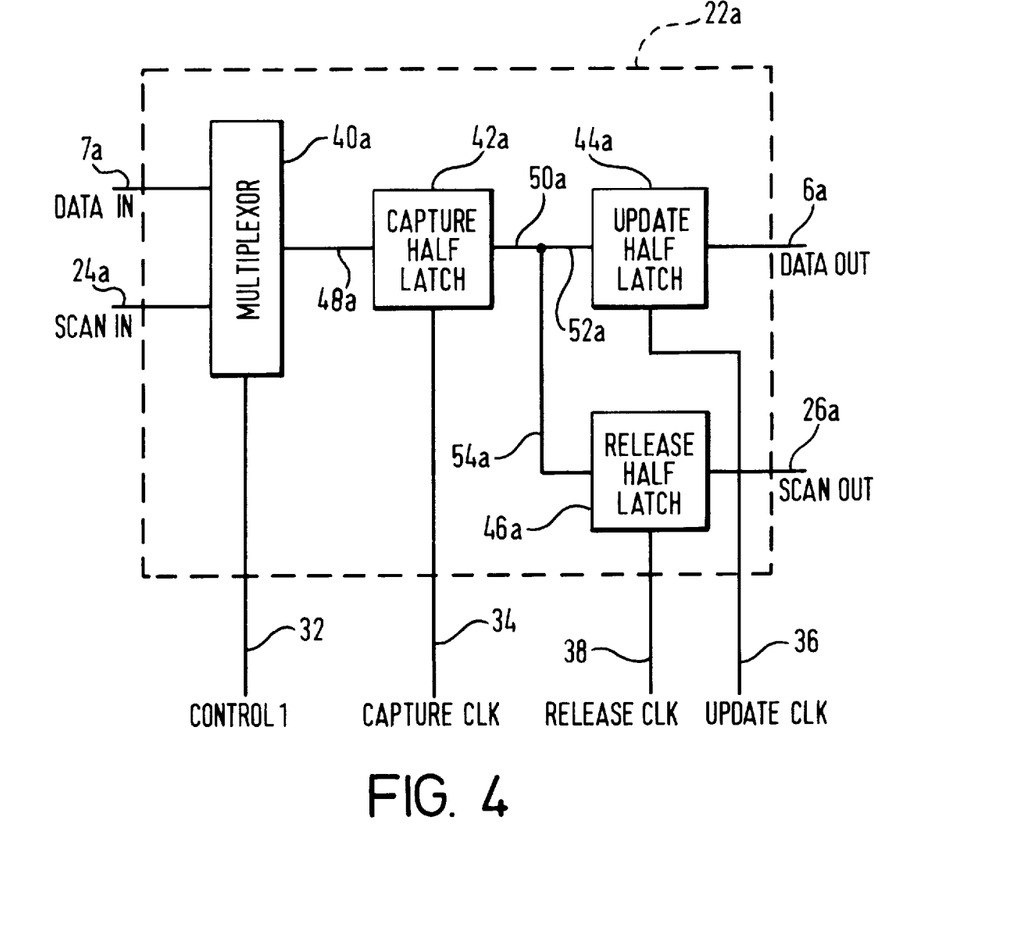
FIG. 4 illustrates a schematic diagram of a known scan cell suitable for carrying out an efficient structural test and an efficient performance test.

The implementation of the scan cell 22a of FIG. 3 is shown in FIG. 4. In FIG. 4 the same reference numerals have been used for components and connections which are common to FIGS. 1 to 3. The scan cells 22b and 22c will be identical to the scan cell 22a with reference numerals annotated b and c as appropriate.

Referring to FIG. 4 it can be seen that the scan cell 22a comprises a multiplexor 40a, a capture half-latch 42a, a release half-latch 46a and an update half-latch 44a. Each of the half-latches 42a, 44a, 46a may be identical to the half-latch 8a or 10a described with reference to FIG. 2 hereinabove. The multiplexor receives as a first input the input signal DATAIN on line 7a and as a second input the input signal SCANIN on line 24a. The output of the multiplexor on line 48a forms the input to the capture half-latch 42a. The output of the capture half-latch 42a on line 50a is connected to the input of the update half-latch 44a on line 52a and the input of the release half-latch 46a on line 54a. The output of the update half-latch forms the output signal DATAOUT on line 6a and the output of the release half-latch forms the output signal SCANOUT on line 26a. The multiplexor 40a is controlled by the control signal CONTROL1 on line 32 to connect one of the two input lines 7a and 24a to the output line 48a. The half-latches 42a, 44a, 46a are controlled by the clock signals CAPTURECLK, UPDATECLK and RELEASECLK respectively, such that they can be in either a data retention or a data transfer state.

A scan cell such as that shown in FIG. 4 allows a test of both the functionality and the performance of a combinational logic block to be carried out. The functionality of the combinational logic block is tested by means of a so-called structural test which tests the logical correctness of an output for an extant set of inputs. The performance of the combinational logic is tested by a so-called performance test in which the inputs of the combinational logic block are sensitised with a set of sensitise bits and the output of the combinational logic is allowed to settle. The inputs are then changed to a set of activation bits and the time taken for the output to change from the value set in response to the activation input is a measure of the performance of the combinational logic. Structural and performance tests using the scan cell of FIG. 4 are fully described in copending British Patent Application No. (Page White & Farrer Ref. No. 79209) the contents of which are herein incorporated by reference, and for a detailed description of such tests reference should be made thereto.

The operation of the scan cell illustrated in FIGS. 3 and 4 in carrying out a performance test will now be briefly described.

During normal functional operation, the multiplexor 40a is controlled by the control signal CONTROL1 on line 32 such that its output on line 48a is connected to the DATAIN signal on the input line 7a. The clock signal RELEASECLK on line 38 is held inactive, and the clock signals CAPTURECLK and UPDATECLK on lines 34 and 36 are clocked in antiphase such that the half-latches 42a and 44a in combination function as the full-latch 4a of FIG. 1. It will therefore be appreciated that in these circumstances the scan cell 22a operates as a single edge triggered latch under the control of the clock signals CAPTURECLK and UPDATECLK, with data on the DATAIN input line 7a being clocked through to the DATAOUT line 6a.

When the controller 56 indicates that a performance test is to be carried out, the control signal CONTROL1 on line 32 is switched such that the output of the multiplexor on line 48a is connected to the SCANIN input on line 24a. The clock signal UPDATECLK on line 36 is then held such that the update half-latch 44a remains in the data retention state. The clock signals CAPTURECLK and RELEASECLK on lines 34 and 38 respectively are then clocked in antiphase such that the capture half-latch 42a and the release half-latch 46a in combination function as a full latch. The controller 56 then serially outputs, on the output line 28 connected to the SCANIN signal line 24a, sensitise test bits which are clocked serially through the successive scan cells forming a scan chain from the SCANIN input on line 24a to the SCANOUT output on line 26a. It will be understood that a situation will be reached where the sensitise test bit applicable to the scan cell 22a is present on the SCANIN signal line 24a. The half-latch 42a will then be clocked by the clock signal CAPTURECLK on line 34 such that the sensitise bit is transferred to the output line 50a and the clock signal CAPTURECLK will then be held such that the half-latch 42a is held in the data retention state. The update half-latch is then clocked by the clock signal UPDATECLK on line 36 such that this sensitise bit appears on the DATAOUT output line 6a, and then the update half-latch 44a returns to the data retention state such that the sensitise bit is retained on the output line 6a. In this way the inputs to all the combinational logic blocks 2a, 2b are updated to the respective sensitise bits, and after a short delay the outputs of the combinational logic blocks, which appear on the DATAIN input signal lines 7a, 7b, 7c, will change to a new value.

With the update half-latch 44a in its data retention state the controller 56 serially outputs onto the SCANIN signal line 24a activation test bits which are clocked serially through successive scan cells by the clock signals CAPTURECLK and RELEASECLK in the same way that the sensitise test bits were scanned in. As with the sensitise bits a situation will be reached where the activation test bit applicable to the scan cell 22a is present on the SCANIN signal line 24a. By the same sequence of steps as described hereinbefore the scan cell 22a is clocked and controlled such that after a positive edge of the clock signal UPDATECLK on line 36 the activation test bit will be transferred to the DATAOUT output on line 6a of the scan cell. Thus the inputs to all the combinational logic blocks are updated to the respective activation test bits.

After the activation test bit has been placed on the DATAOUT signal line 6a the clock signal UPDATECLK on line 36 is set such that the update half-latch 44a is held in its data retention state. The control signal CONTROL1 on line 32 is then switched such that the multiplexor 40a connects its output on line 48a to its input on line 7a. After a short delay a new result will appear on the DATAIN signal line 7a which is a consequence of the activation test bit applied to the input of the combinational logic block. The capture half-latch 42a is controlled by the clock signal CAPTURECLK on line 34 such that it is in the data transfer state and hence the result will be transferred to the output of the capture half-latch 42a on line 50a and therefore also to the input of the release half-latch 46a on line 54a. The clock signal CAPTURECLK is then forced to change state such that the half-latch 42a enters its data retention state and consequently the result is "captured" on the output of the capture half-latch 50a. It will be appreciated that the time between the activation input being applied to the input of the combinational logic block and the result being captured, by controlling the timing of the clock edge which captures the result on the output of the capture half-latch 42a, is adjustable under the control of the controller.

If the scan cell 22a of FIG. 4 was being used to only perform a structural test then the timing of the capture operation would not be critical. For a structural test there is no requirement to scan in sensitise bits, only activation bits being required.

The captured result on each scan cell can then be scanned out under the control of the clock signals CAPTURECLK and RELEASECLK in the same manner that the sensitise and activation bits were scanned in. It will be appreciated that whilst the captured results are being scanned out by the controller, a new set of sensitise test bits may be scanned in.

Preferably the sensitise bit pattern supplied to the chain of scan latches activates a critical timing path on the transition of the inputs of the combinational logic blocks between the sensitise and activation patterns. It will be understood that the point of a performance test is to measure the time between placing the activation input bits on the inputs of the combinational logic blocks and the appearance of the result on the DATAIN input signal line 7a. The performance test sequence can be repeated for different patterns to exercise different timing paths.

The scan cell described hereinabove provides an efficient mechanism for testing combinational logic blocks interspersed between single memory elements as illustrated by the example of FIG. 1. However, as illustrated by the example of FIG. 5 there may be circuitry associated with scan testing which does not lend itself to such efficient scan testing techniques.

Figure 5:
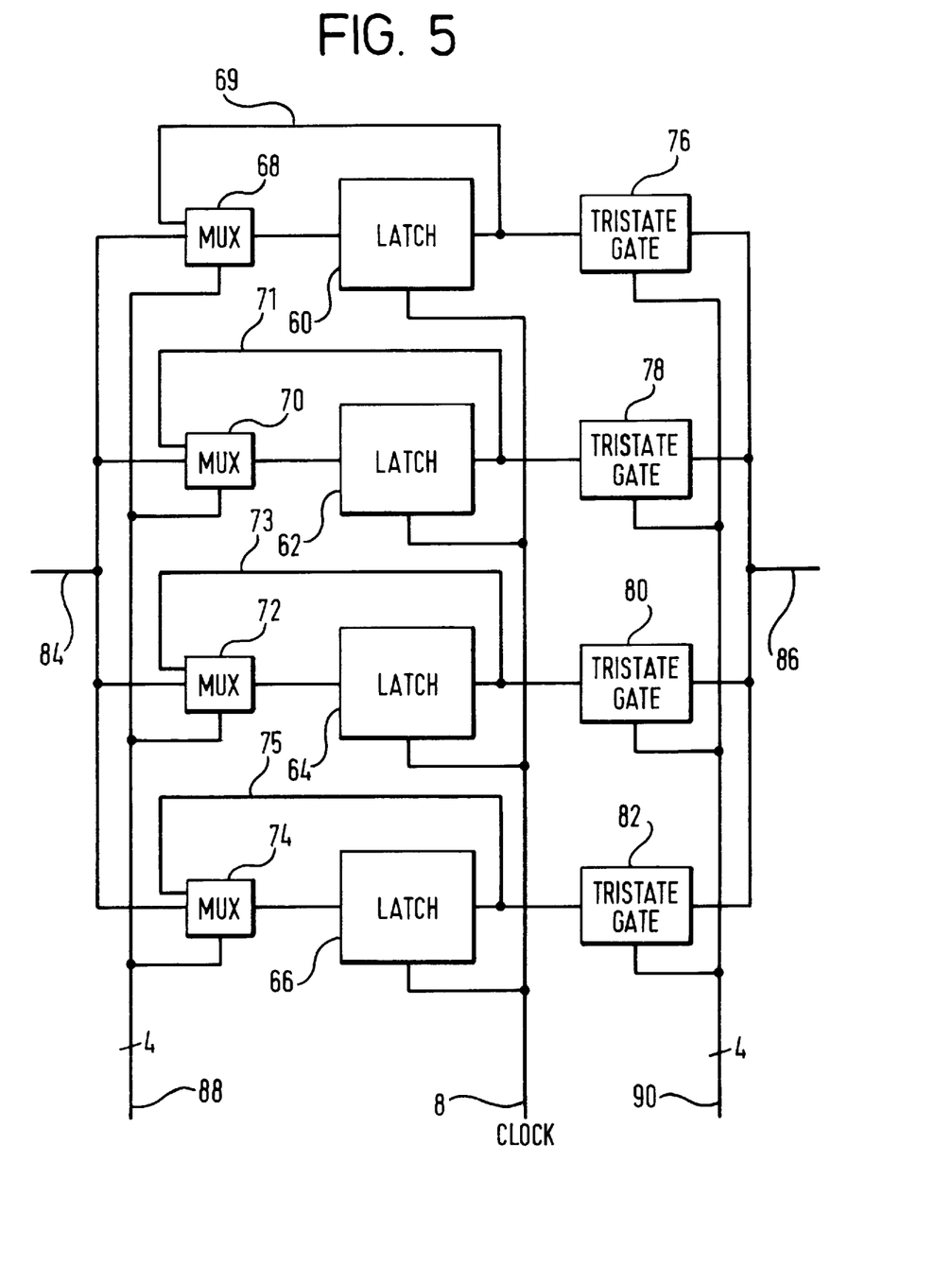
FIG. 5 is a schematic diagram of a parallel configuration of latches.

FIG. 5 shows four memory elements or full latches 60, 62, 64, 66 in parallel each being clocked by the clock signal CLOCK on line 8. There are also shown four multiplexors 68 to 74 and four tristate gates 76 to 82. Each of the multiplexors 68 to 74 receives as one input a common input signal on line 84, and as a second input an output fed back from a respective one of the latches 60 to 66 on a respective one of lines 69 to 75. The output of each of the multiplexors 68 to 74 forms the input of a respective one of the latches 60 to 66. Each of the tristate gates 76 to 82 receives as an input the output of a respective one of the latches 60 to 66. The outputs of each of the tristate gates 76 to 82 are commonly connected to form an output signal on line 86. The multiplexors 68 to 74 are each controlled by a 4-bit address line 88 such that one of the two inputs of each multiplexor is connected to the output of the respective multiplexor. The multiplexors 68 to 74 are controlled by the 4-bit address on line 88 such that only one of the four multiplexors connects its output to the input signal on line 84 at any time, the other three multiplexors connecting their outputs to the outputs of the respective one of the outputs of the latches 60 to 66. This feedback merely ensures that when a latch is not receiving the input signal on line 84 as its input it receives its own output as its input, and therefore guarantees that the latch retains its stored value and does not float to a different value. A tristate gate could serve the purpose of isolating the inputs of the latches 60 to 66 from the input signal on line 84. However, the inputs of the latches may then float to an undesirable signal level and effect the output thereof when the tristate gate is disabled. The feedback arrangement with multiplexors therefore merely ensures the outputs of the latches are maintained at a known level.

Each tristate gate 76 to 82, when enabled, transfers either a '1' or a '0' from its input to its output as appropriate, but is in a high impedance state when disabled. The tristate gates 76 to 82 are enabled by a 4-bit address on line 90 such that only one of the gates is enabled at any one time.

The multiplexors 68 to 74 are controlled by the address lines 88 such that the input signal is connected to the input of one or more of the latches 60 to 66 at any instant. Similarly the tristate gates 76 to 82 are controlled by the address lines 90 such that the output of one and only one latch is connected to the output line 86 at any instant. The multiplexors 68 to 74 and the tristate gates 76 to 82 can be controlled by the address lines 88 and 90, such that one or more of the latches 60 to 66 can be written to (i.e. have its associated input tristate gate selected) whilst a different one of the latches 60 to 66 can be read from (i.e. have its associated output tristate gate selected), or such that the same latch can be written to and read from at once.

In practice the structure illustrated in FIG. 5 may be used to implement a bank of registers in a CPU. In such an implementation the structure of FIG. 5 may be replicated 32 times to form a 4×32 bit register bank or memory, only 32 bits of which can be accessed at any instant. Such CPU register banks are well known.

In order to make such a latch configuration compatible with scan testing it is necessary to replace each of the latches 60 to 66 with a scan cell such as that described hereinabove with reference to FIG. 4. However, a problem arises in that this introduces a large amount of additional circuitry. Furthermore, the TAP controller, which controls the scan testing, is configured to scan test combinational logic blocks serially interspersed with scan cells, and has no provision for scan testing a parallel/tristate structure such as that shown in FIG. 5.

Furthermore, to enable scan testing it is essential to control the multiplexors 68 to 74 and the tristate gates 76 to 82 with the address lines 88 and 90 such that any one, but only one, of the latches 60 to 66 can be read from or written to simultaneously.

As scan testing is an efficient technique for testing circuitry it is desirable to enable as many parts of an integrated circuit as possible to be tested by such techniques. However, it can be appreciated that adopting circuitry to be compatible with scan testing can introduce additional expenses in respect of the additional chip space consumed by incorporating scan cells such as that illustrated in FIG. 4. It would therefore be desirable to minimise the amount of additional logic required for scan testing.

It is therefore an object of the present invention to provide a scan latch and an efficient method of testing a scan latch which includes storage elements connected in parallel.

SUMMARY OF THE INVENTION

According to a first aspect of the present invention there is provided a scan latch comprising a plurality of capture half-latches connected in parallel between an input node and an intermediate node and a release half-latch connected between the intermediate node and a scan output node, each capture half-latch having a control terminal, a capture select terminal and a release select terminal, said control terminals receiving a common timing control signal, said capture select terminals receiving respective capture select signals for controlling the capture of data inputted to the scan latch, and said release select terminals receiving respective release select signals for controlling the release of data from the capture half-latches;

control circuitry for generating release select signals and capture select signals for selectively controlling said capture half-latches in a normal functional mode of operation;

test control circuitry for generating release select signals and capture select signals for selectively enabling said capture half-latches in a test mode, said test control circuitry comprising: a test controller for supplying a sequence of test data bits to the scan latch under the control of the timing control signal, and addressing circuitry for simultaneously addressing both the capture select terminal and the release select terminal of each capture half-latch in turn, wherein each capture half-latch can be tested successively.

The test controller and the addressing circuitry can cooperate to test each capture half-latch in successive scan tests or in successive scan cycles of a scan test. The addressing circuitry preferably comprises a plurality of sequentially connected latches for storing address bits and for providing said capture select signals and said release select signals. Preferably said sequentially connected latches are connected in a scan chain and the address bits stored in said latches form an independently generated test vector.

The independently generated test vector is simple enough to be manually generated.

According to a second aspect of the present invention there is provided a plurality of capture half-latches connected in parallel between an input node connected to receive an input signal and an intermediate node, each capture half-latch having a control terminal connected to receive a common clock signal, a capture select terminal connected to receive a capture address and a release select terminal connected to receive a release address;

a release half-latch being connected between the intermediate node and a scan output node, having a control terminal connected to receive a clock signal; and an update half-latch being connected between the intermediate node and a data output node, having a control terminal connected to receive a clock signal.

According to a third aspect of the present invention there is provided a method of operating a scan latch to perform a test of the functionality of a plurality of capture half-latches, said scan latch comprising a plurality of capture half-latches connected in parallel between an input node and an intermediate node and a release half-latch being connected between the intermediate node and a scan output node, the method comprising the steps of:

providing a predetermined sequence of scan test bits;

shifting the sequence of scan test bits through the scan latch from the input node to the scan output node; and comparing the sequence of bits shifted out of the scan output node with the sequence of scan test bits shifted in;

wherein said shifting step includes the step of selecting each one of the plurality of capture half-latches in turn successively.

The step of selecting each one of the plurality of capture half-latches in turn successively can include selecting a different capture half-latch in successive scan tests or in successive scan cycles of a scan test.

For a better understanding of the present invention and to show how the same may be carried into effect, reference will now be made by way of example to FIGS. 6 to 8 of the accompanying drawings.

DESCRIPTION OF THE PREFERRED EMBODIMENTS

Figure 6:
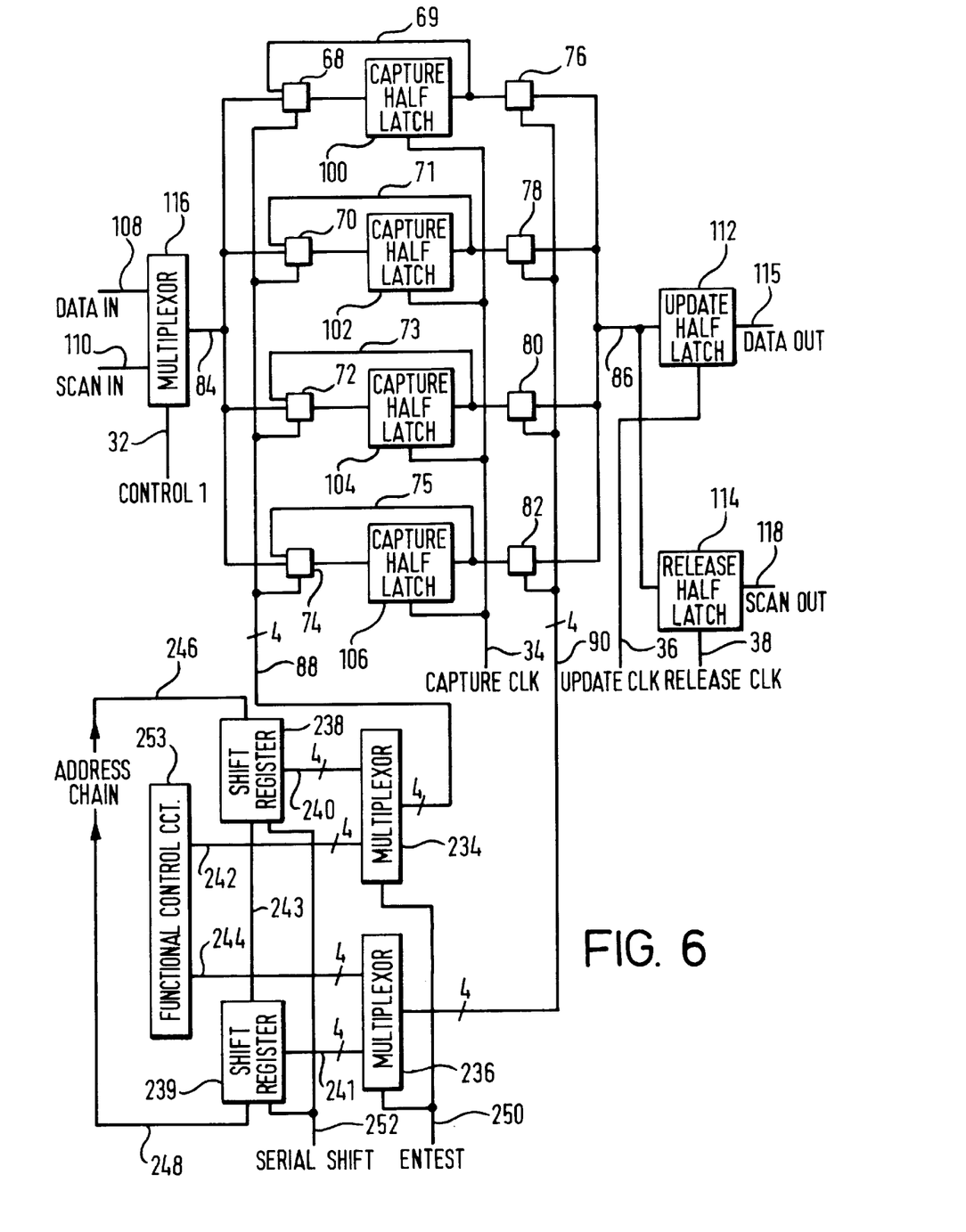
FIG. 6 is a schematic diagram of a scan latch illustrating a test method in accordance with an embodiment of the present invention.

Reference is first made to FIG. 6 which illustrates a circuit which can be used in place of the circuit of FIG. 5 and which enables scan testing to be carried out. Reference numerals are the same as for like parts in FIG. 5. It can be clearly seen that the overheads associated with scan testing such as the multiplexor and additional half-latch are considerably reduced over the circuitry that would be required if each latch 60 to 66 of FIG. 5 was replaced with a scan cell 22*a* as shown in FIG. 4.

Referring to FIG. 6, it can be seen that each of the full latches 60 to 66 of FIG. 5 have been replaced by a respective capture half-latch 100 to 106 clocked by the clock signal CAPTURECLK on line 34. The input signal line 84, which forms the inputs to the multiplexors 68 to 74, is connected to the output of a multiplexor 116. The multiplexor receives as a first input a signal DATAIN on line 108 and as a second input a signal SCANIN on line 110, and is controlled by the control signal CONTROL1 on line 32. The output signal line 86 which is connected to the outputs of the tristate gates 76 to 82 forms the input respectively to an update half-latch 112 and a release half-latch 114. The output of the update half-latch is the DATAOUT signal on a line 115 and the output of the release half-latch is the SCANOUT signal on a line 118. The update half-latch 112 and the release half-latch 114 are clocked by the clock signals UPDATECLK and RELEASECLK on lines 36 and 38 respectively.

The address lines 88 controlling the multiplexors 68 to 74 are derived directly from the output of a multiplexor 234, and the address lines 90 controlling the tristate gates 76 to 82 are derived directly from the output of a multiplexor 236. The multiplexor 234 has one set of 4-bit inputs connected to the 4-bit parallel output on line 240 of a four bit shift register 238. The multiplexor 236 has one set of 4-bit inputs connected to the 4-bit parallel output on line 241 of a four bit shift register 239. The multiplexor 234 has a second set of inputs connected to a 4-bit address on line 242 and the multiplexor 236 has a second set of inputs connected to a 4-bit address on line 244. The four bit addresses on lines 242 and 244 are both generated by a functional control circuit 253. The multiplexors 234 and 236 are both controlled by a control signal ENTEST on line 250 to connect one of the respective set of inputs to the respective output. The shift register 238 receives a serial input on line 246 and generates a serial output on line 243 which forms a serial input to the shift register 239, which in turn generates a serial output on line 248. Serial shift-in and shift-out at shift registers 238 and 239 is controlled by a clock signal SERIALSHIFT on line 252. The 4-bits of the shift register 238 are transparent to the output lines 240 such that the 4-bit output line 240 always has the value of the 4-bit shift register. Similarly the four bits of the shift register 239 are transparent to the output lines 241 such that the 4-bit output line 241 always has the value of the 4-bit shift register.

During normal operation of the circuit of FIG. 6, the multiplexor 116 is controlled by the control signal CONTROL1 on line 32 such that the DATAIN signal on line 108 is connected to the output line 84 of the multiplexor. The clock signal RELEASECLK on line 38 is held such that the release half-latch 114 is not clocked. The clock signals CAPTURECLK and UPDATECLK on lines 34 and 36 respectively are clocked in antiphase such that the selected one of the capture half-latches 100 to 106 cooperates with the update half-latch 112 to function as a full latch. Furthermore, during normal functional operation the control signal ENTEST on line 250 is set such that the multiplexor 234 connects its output signals on line 88 to its input signals on line 242, and the multiplexor 236 connects its output signals on line 90 to its input signals on line 244. The shift registers 238 and 239 are disconnected from the circuit of FIG. 6 during normal functional operation.

The address signals on lines 242 and 244 are generated by the functional control circuit 253, the operation of which is not concerned with the present invention. However, it is important to note that the 4-bit address on lines 242 and 244 may be identical, so that one of the capture half-latches 100 to 106 can be written to or read from simultaneously as was described hereinabove with reference to FIG. 5. However, it is more usual for the two 4-bit addresses to be different, such that during normal functional operation of the circuit of FIG. 6 the input line 84 is not normally connected to the same capture half-latch as the output line 86. It can therefore be seen that during normal functional operation the circuit of FIG. 6 functions in exactly the same manner as the circuit of FIG. 5.

When a scan test is to be performed the control signal ENTEST on line 250 is switched such that the multiplexor 234 connects its 4-bit output on line 88 to the 4-bit output on line 240 of the shift register 238, and the multiplexor 236 connects its 4-bit output on line 90 to the 4-bit output on line 241 of the shift register 239. The 4-bit addresses on lines 240 and 241 are derived from the 4-bit shift registers 238 and 239. The shift registers 238 and 239 are controlled by the clock signal SERIALSHIFT on line 252 such that the contents of the shift register 238 are serially shifted through one bit on each cycle of the clock SERIALSHIFT. The clock signal SERIALSHIFT is derived from the same clock as the clock signals CAPTURECLK, RELEASECLK and UPDATECLK such that during a scan-in or a scan-out operation the shift register 238 is clocked at the same frequency as the capture and release half-latches. It should be noted that during a scan test the contents of the shift register 238 must match the contents of the shift register 239.

During a normal scan test where the circuit of FIG. 6 is merely required to form part of the scan chain only one of the capture half-latches 100 to 106 can be used and therefore tested. A 4-bit value will be serially shifted into the shift registers 238 and 239 such that the address lines 88 and 90 are controlled so that one of the capture half-latches 100 to 106 is connected between the input line 84 and the output line 86. During such a test operation the controller 56 directly controls the bits input to the shift registers 238 and 239 and therefore directly controls which of the capture half-latches 100 to 106 is selected for a normal scan test. For such a normal scan test once a first 4-bit value is loaded into the shift registers 238 and 239 then this value may be retained throughout the test.

It is of course desirable to test all four of the capture half-latches 100 to 106, and for this purpose the invention provides a special test mode. In order to test each of the capture half-latches 100 to 106 it is only necessary to scan test data in and then out through the capture half-latch selected and the release half-latch 114 under the control of the respective clock signals CAPTURECLK and RELEASECLK on lines 34 and 38, and check that the data scanned out matches the test data scanned in. The special test mode provides an efficient method for performing such a test.

During a special test mode, a full scan-in and scan-out may be performed for each capture half-latch 100 to 106, such that four scan tests need to be performed. It should be noted, however that these scan tests will be simpler than a structural or performance scan test. A 4-bit test pattern is fed through the shift registers 238 and 239 to successively select each of the capture half-latches in successive tests. Alternatively, on successive cycles of the scan clock signal (i.e. the clock signal which clocks the capture half-latches 100 to 106, the release half-latch 114 and the shift registers 238 and 239) an address may be serially fed through the shift registers 238 and 239 from the input line 246 to the output line 248 such that different ones of the capture half-latches 100 to 106 are successively selected for each successive test bit scanned in. A cyclical 4-bit test pattern can then, if desired, be constantly fed through the shift register 238 and 239. At least four clock cycles are required to test the four capture half-latches 100 to 106. It is important during a scan test that only one of the four capture half-latches 100 to 106 is selected at any instant. This could be guaranteed by, for example, ensuring that the bits serially clocked through the shift registers 238 and 239 comprise at least three '0's between each '1', a '1' selecting a multiplexor 68 to 74 or a tristate gate 76 to 82.

The four bits of the shift registers 238 and 239 may actually be represented by four scan latches in a different scan chain. In such a case the 4-bit address entered into the shift registers 238 and 239 would be generated by the controller associated with that scan chain. If the scan latches so used have an update capability as has been described hereinabove, then the additional clock signal SERIAL-SHIFT can be eliminated, with the shift registers 238 and 239 being controlled by the standard control and clock signals as described hereinabove, for example, with reference to FIG. 4. In such an implementation, however, it would be necessary to ensure that the address scan chain of which the registers 238 and 239 form a part is not updated until the test vector shifted through such registers is in the correct position.

From the foregoing description it can be seen that the circuit of FIG. 5 has been replaced by a circuit for scan testing without substantially affecting the amount of chip area consumed by components associated only with scan testing. The functional circuit of FIG. 5 which consisted of eight half-latches (two for each full latch) has been replaced by a functional circuit which is fully scan testable and which consists of only six half-latches and an additional multi-plexor.

If the shift registers 238 and 239 had a facility for parallel loading thereof, then the multiplexors 234 and 236 could be eliminated. During normal operation of the circuit of FIG. 6, the functional control circuit could parallel load the two shift registers 238 and 239, the outputs of which would be directly connected to the lines 88 and 90 respectively. During scan test the parallel load could be inhibited and test data could be serially shifted into the shift registers 238 and 239. However, even in test mode the shift registers could be initialised by parallel loading an initial test vector into the shift registers 238 and 239. This is more efficient than serially loading the initial test vector into the scan shift registors since it takes less time.

Figure 7:
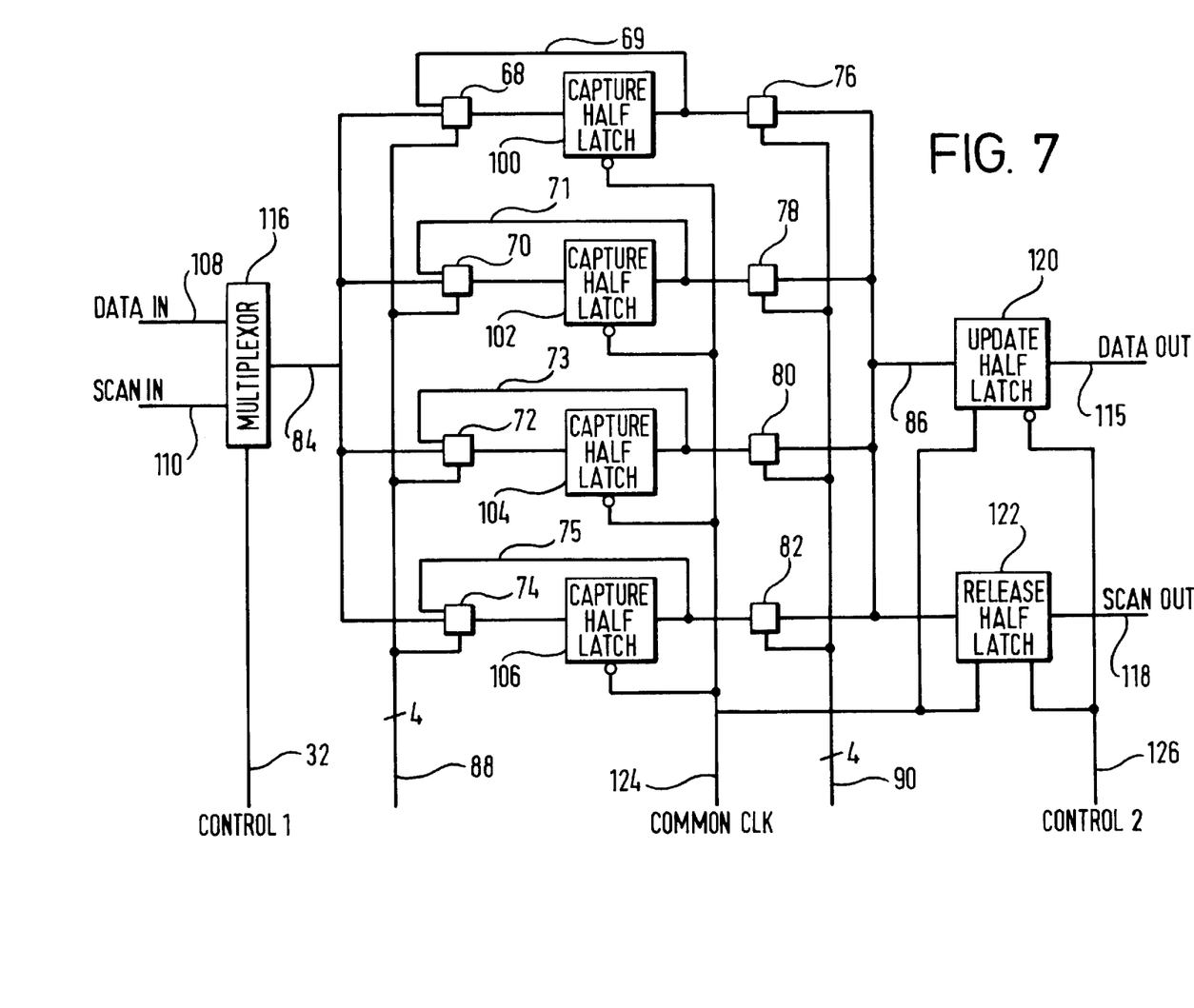
FIG. 7 is a schematic diagram of a scan latch in accordance with an embodiment of the present invention.

The circuit of FIG. 6 is, however, inefficient in some applications in that it requires three clock signals which can be expensive in terms of power consumption, routing over-heads etc. In our co-pending British Patent Application No. 9417590.8 the scan cell 22a previously described herein-above with reference to FIG. 4 is replaced by a scan cell having a single clock replacing the three clock signals CAPTURECLK, RELEASECLK and UPDATECLK. FIG. 7 shows part of the circuit of FIG. 6 adapted according to such a scan cell to be controlled by a single clock. In FIG. 7 reference numerals are the same as for like parts in FIG. 6.

In FIG. 7 the half-latches 112, 114 of FIG. 6 have been replaced by gate controlled half-latches 120, 122 which receive a clock signal and a control signal. The capture half-latches 100 to 106 are clocked by the inverse of a common clock signal COMMONCLK on line 124 which also clocks the gate controlled update half-latch 120 and the gate controlled release half-latch 122. The gate controlled update half-latch 120 is enabled by the inverse of a control signal CONTROL2 on line 126 and the gate controlled release half-latch 122 is enabled by the control signal CONTROL2 on line 126.

The operation of the circuit of FIG. 7 in carrying out a performance test will now be described. It is assumed that in carrying out the performance test the multiplexor 74 is controlled to connect the input on line 84 to its output and the tristate gate 82 is enabled such that the capture half-latch 106 is connected between the input line 84 and the output line 86. All the multiplexors and tristate gates 68 to 72 and 76 to 80 are then disabled.

When the controller indicates that a performance test is to be carried out, the control signal CONTROL1 on line 32 is switched such that the output of the multiplexor on line 84 is connected to the input SCANIN of the multiplexor on line 110. The control signal CONTROL2 is set such that the gate-controlled update half-latch 120 is disabled and the gate-controlled release half-latch 122 is enabled. The controller then serially outputs onto the SCANIN signal line 110 sensitise test bits which are clocked serially through the successive scan cells in the scan chain from the SCANIN input on line 110 to the SCANOUT output on line 118. It will be understood that a situation will be reached where the sensitise test bit applicable to the scan cell is present on the SCANIN signal line 110. On the next falling edge of the clock signal COMMONCLOCK the capture half-latch 106 becomes transparent and this sensitise bit will be transferred to the output line 86. Before the next rising edge of the clock signal COMMONCLOCK the control signal CONTROL2 is switched such that the gate-controlled update half-latch 120 is enabled and the gate-controlled release half-latch 122 is disabled. Then on the positive edge of the clock signal COMMONCLOCK the sensitise test bit on the output line 86 will be transferred to the output of the gate-controlled update half-latch 120 and consequently the DATAOUT output line 115 of the scan cell. Thus the inputs to all the combinational logic blocks are updated to the respective sensitise bits and after a short delay the outputs of the combinational logic blocks, which appear on the DATAIN input signal lines, will change to a new value.

The control signal CONTROL2 then reverts back to its previous state such that the gate-controlled update half-latch 120 is disabled again and consequently the sensitise test bit is retained on the DATAOUT output line 115.

The controller then serially outputs on the SCANIN signal line 110 activation test bits which are clocked serially through the successive scan cells in the scan chain in the same way that the sensitise test bits were scanned in. As with the sensitise test bits a situation will be reached where the activation test bit applicable to the scan cell is present on the SCANIN signal line 110. By the same sequence of steps described hereinbefore the scan cell is clocked and controlled such that after a positive edge of the clock signal COMMONCLOCK the activation test bit will be transferred to the DATAOUT output line 115 of the scan cell. Thus the input to all the combinational logic blocks are updated to the respective activation test bits.

After the positive edge of the clock signal COMMONCLOCK which causes this update, a negative edge is forced on the clock signal COMMONCLOCK by means of the controller earlier than would normally be expected with the normal clock cycle, and the activation test bit is therefore retained on the output DATAOUT since the gate-controlled update half-latch 120 will now be in its data retention state. The control signals CONTROL1 and CONTROL2 are then switched such that the multiplexor 116 connects its output on line 84 to its DATAIN input on line 108, the gate-controlled update half-latch is disabled and the gate-controlled release half-latch is enabled. After a short delay a new result will appear on the DATAIN signal line 108 which is a consequence of the activation test bit applied to the input of the combinational logic block, and as the capture half-latch 106 is in the data transfer state this result will be transferred to the output of the capture half-latch on line 86. The clock signal COMMONCLOCK is then forced high (under the control of the controller) earlier than would normally be expected and this positive clock edge causes the result to be retained on the line 86 since the half-latch 106 will now be in its data retention state. Thus the result has been "captured" by the scan cell. It will be appreciated that the time between the activation input being applied to the input of the combinational logic block and the result being captured by controlling the timing of the first positive clock edge of the signal COMMONCLOCK after the positive clock edge of the signal COMMONCLOCK which updates the DATAOUT output signal on line 115 with the activation test bit is adjustable under control of the controller.

If the scan cell of FIG. 7 was being used to perform only a structural test and not a performance test, then there would be no need for the controller to force the early positive clock edge of the clock signal COMMONCLOCK. The timing of the capture of the result is not important for a structural test and so it would be acceptable to await the next positive clock edge in the normal cycle of the clock signal COMMONCLOCK. It will also be understood that for a structural test there is no requirement to scan in sensitise test bits, only activation test bits being required.

The captured result on each scan cell can then be scanned out under the control of the clock signal COMMONCLOCK in the same manner that the sensitise and activation bits were scanned in. It will be appreciated that whilst the captured results are being scanned out by the controller, a new set of sensitise test bits may be scanned in.

To test each individual capture latch, the special test method described above with reference to the circuit of FIG. 6 can be used in precisely the same manner for the circuit of FIG. 7.

Figure 8:
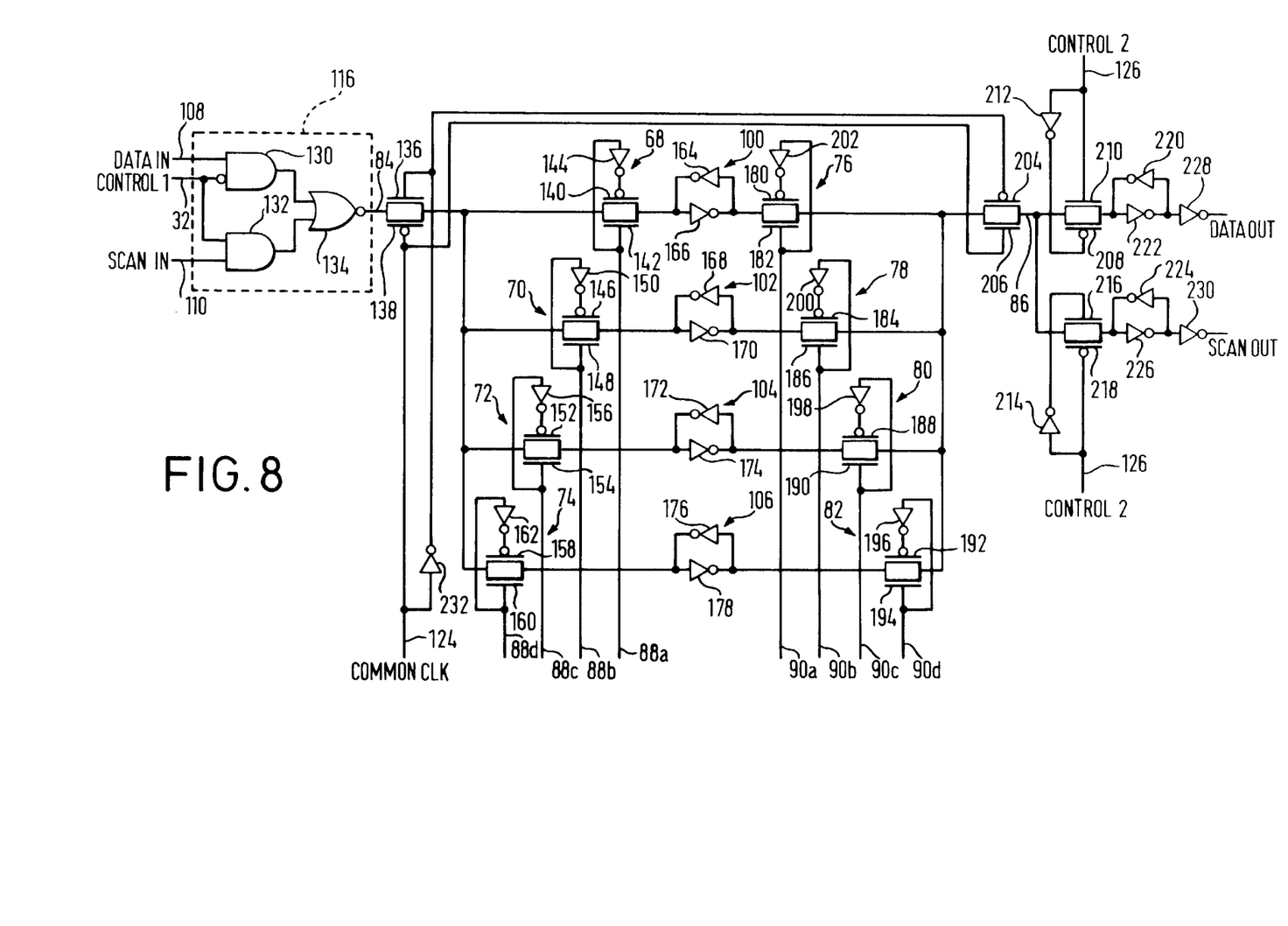
FIG. 8 is a circuit implementation of the schematic of FIG. 7.

FIG. 8 is an illustrative example of one specific implementation of the schematic circuit of FIG. 7 using known circuit components. Reference numerals are the same as for like parts in FIG. 7.

The multiplexor 116 consists of two double input AND gates 130, 132 and a NOR gate 134, the AND gate 130 having one of its inputs inverted. The AND gate 130 receives the DATAIN signal on line 108 at its noninverting input and the control signal CONTROL1 on line 32 at its inverting input. The AND gate 132 receives at its two inputs the SCANIN signal on line 110 and the control signal CONTROL1 on line 32. The capture half-latches 100 to 106 have a common clocking element comprising a complimentary pair of transistors 136, 138 connected as a pass gate in a path between the output of the multiplexor 116 and the inputs to the tristate gates 68 to 74. The p-channel transistor 138 is controlled by the clock signal COMMONCLK and the n-type transistor 136 is controlled by the inverse of the clock signal COMMONCLK which is generated by an inverter 232. The capture half-latch 100 is represented by a storage node comprising a strong inverter 166 and a weak inverter 164 connected in a back-to-back configuration. The capture half-latch 102 is represented by a storage node comprising a strong inverter 170 and a weak inverter 168 connected in a back-to-back configuration. The capture half-latch 104 is represented by a storage node comprising a strong inverter 174 and a weak inverter 172 connected in a back-to-back configuration. The capture half-latch 106 is represented by a storage node comprising a strong inverter 178 and a weak inverter 176 connected in a back-to-back configuration.

The multiplexors 68 to 74 are, in this specific embodiment, implemented as tristate gates. Such an implementation is acceptable in this embodiment since the capture half-latches 100 to 106 are implemented as back-to-back inverters which themselves feedback the output of the latch to the respective input. The feedback inverter is a weak inverter such that when a respective one of the tristate gates 68 to 74 is enabled the input to the latch can be driven to a new value.

The tristate gate 68 comprises a pair of complimentary transistors 140, 142 with their control terminals interconnected via an inverter 144. The tristate gate 70 comprises a pair of complimentary transistors 146, 148 with their control terminals interconnected by an inverter 150. The tristate gate 72 comprises a pair of complimentary transistors 152, 154 with their control terminals interconnected by an inverter 156. The tristate gate 74 comprises a pair of complementary transistors 158, 160 with their control terminals interconnected by an inverter 162. The tristate gate 68 is controlled by one bit on line 88a of the 4-bit address on line 88 such that the control terminal of the n-channel transistor 142 is connected to the signal line 88a, and the p-channel transistor 140 is connected to the inverse of the signal line 88a by the inverter 144. The tristate gate 70 is controlled by one bit on line 88b of the 4-bit address on line 88 such that the control terminal of the n-channel transistor 148 is connected to the signal line 88b, and the p-channel transistor 146 is connected to the inverse of the signal line 88b by the inverter 150. The tristate gate 72 is controlled by one bit on line 88c of the 4-bit address on line 88 such that the control terminal of the n-channel transistor 154 is connected to the signal line 88c, and the p-channel transistor 152 is connected to the inverse of the signal line 88c by the inverter 156. The tristate gate 74 is controlled by one bit on line 88d of the 4-bit address on line 88 such that the control terminal of the n-channel transistor 160 is connected to the signal line 88d, and the p-channel transistor 158 is connected to the inverse of the signal line 88d by the inverter 162.

The tristate gate 76 comprises a pair of complimentary transistors 180, 182 with their control terminals interconnected via an inverter 202. The tristate gate 78 comprises a pair of complimentary transistors 184, 186 with their control terminals interconnected by an inverter 200. The tristate gate 80 comprises a pair of complimentary transistors 188, 190 with their control terminals interconnected by an inverter 198. The tristate gate 82 comprises a pair of complementary transistors 192, 194 with their control terminals interconnected by an inverter 196. The tristate gate 76 is controlled by one bit on line 90a of the 4-bit address on line 90 such that the control terminal of the n-channel transistor 182 is connected to the signal line 90a, and the p-channel transistor 180 is connected to the inverse of the signal line 90a by the inverter 202. The tristate gate 78 is controlled by one bit on line 90b of the 4-bit address on line 90 such that the control terminal of the n-channel transistor 186 is connected to the signal line 90b, and the p-channel transistor 184 is connected to the inverse of the signal line 90b by the inverter 200. The tristate gate 80 is controlled by one bit on line 90c of the 4-bit address on line 90 such that the control terminal of the n-channel transistor 190 is connected to the signal line 90c, and the p-channel transistor 188 is connected to the inverse of the signal line 90c by the inverter 198. The tristate gate 82 is controlled by one bit on line 90d of the 4-bit address on line 90 such that the control terminal of the n-channel transistor 194 is connected to the signal line 90d, and the p-channel transistor 192 is connected to the inverse of the signal line 90d by the inverter 196.

The gate controlled update half-latch 120 and the gate controlled release half-latch 122 both have a common clocking element represented by two complementary transistors 204, 206. The p-channel transistor 204 receives the inverse of the clock signal COMMONCLK and the n-channel transistor receives the clock signal COMMONCLK. The complementary transistors 204, 206 are connected as a pass gate in a path between the outputs of the tristate gates 76 to 82 and the output line 86. The update half-latch further comprises a pair of complimentary transistors 208, 210 configured as a pass gate and having their control terminals interconnected by an inverter 212, a storage node comprising a strong inverter 222 and a weak inverter 220 connected in a back-to-back configuration, and an output inverter 228. The complimentary transistors 208, 210, are controlled by the control signal CONTROL2 on line 126 such that the control terminal of the n-channel transistor 210 is connected to the signal line 126 and the p-channel transistor 208 is connected to the inverse of the signal line 126 by the inverter 212. The release half-latch further comprises a pair of complimentary transistors 216, 218 having their control terminals interconnected by an inverter 214, a storage node comprising a strong inverter 226 and a weak inverter 224 connected in a back-to-back configuration, and an output inverter 230. The complimentary transistors 216, 218 are controlled by the control signal CONTROL2 on line 126 such that the control terminal of the p-channel transistor 218 is connected to the signal CONTROL2 on line 126 and the n-channel transistor 216 is connected to the inverse of the signal CONTROL2 on line 126 by the inverter 214.

It should be apparent to a person skilled in the art having reference to the foregoing description of FIGS. 1 to 7 how the example implementation of FIG. 8 operates, and a detailed description will therefore not be given herein.

It will be apparent from the foregoing description that the present invention provides an efficient method for scan testing any circuitry where only limited access is available to parts of the circuit. The invention is particularly advantageous for use in any register intensive design where only semi-parallel access to latches is required. The primary application of this invention is where a scan test architecture is to be applied to test a four priority CPU, the state of only one of the four priorities needing to be accessible at any one time.

What is claimed is:

1. Scan test circuitry including:

a scan latch comprising a plurality of capture half-latches connected in parallel between an input node and an intermediate node and a release half-latch connected between the intermediate node and a scan output node, each capture half-latch having a control terminal, a capture select terminal and a release select terminal, said control terminals receiving a common timing control signal, said capture select terminals receiving respective capture select signals for controlling the capture of data inputted to the scan latch, and said release select terminals receiving respective release select signals for controlling the release of data from the capture half-latches;

control circuitry for generating release select signals and capture select signals for selectively controlling said capture half-latches in a normal functional mode of operation;

test control circuitry for generating release select signals and capture select signals for selectively enabling said capture half-latches in a test mode, said test control circuitry comprising: a test controller for supplying a sequence of test data bits to the scan latch under the control of the timing control signal, and addressing circuitry for simultaneously addressing both the capture select terminal and the release select terminal of each capture half-latch in turn, wherein each capture half-latch can be tested successively.

2. The scan test circuitry of claim 1 wherein the test controller and the addressing circuitry cooperate to test each capture half-latch in successive scan tests.

3. The scan test circuitry of claim 1 wherein the test controller and the addressing circuitry cooperate to test each capture half-latch in successive scan cycles of a scan test.

4. The scan test circuitry of claim 1 wherein the addressing circuitry comprises a plurality of sequentially connected latches for storing address bits and for providing said capture select signals and said release select signals.

5. The scan test circuitry of claim 4 wherein said sequentially connected latches are connected in a scan chain and the address bits stored in said latches form an independently generated test vector.

6. The scan test circuitry of claim 1 further comprising a switching circuit for switching between the control circuitry and the test control circuitry.

7. The scan test circuitry of claim 1 wherein the release half-latch has a control terminal controlled by a timing control signal such that a selected capture half-latch cooperates with the release half-latch to provide a positive edge triggered latch.

8. The scan test circuitry of claim 1 further including:
an update half-latch connected between the intermediate node and a data output node, said update half-latch having a control node.

9. The scan test circuitry of claim 8 wherein the control node of the update half-latch is controlled by a signal independent of the signals controlling the control nodes of the capture and release half-latches.

10. The scan test circuitry of claim 1 wherein the control nodes of the capture half-latches are controlled by a signal independent of the signal controlling the control node of the release half-latch.

11. The scan test circuitry of claim 1 wherein the release half-latch further includes an enable gate and the control terminal of the release half-latch is controlled by the same signal controlling the control terminals of the capture half-latches.

12. The scan test circuitry of claim 11 wherein the update half-latch further comprises an enable gate and the control terminal of the update half-latch is controlled by the same signal controlling the control terminals of the capture half-latches.

13. A scan latch comprising:
a plurality of capture half-latches connected in parallel between an input node connected to receive an input signal and an intermediate node, each capture half-latch having a control terminal connected to receive a common clock signal, a capture select terminal connected to receive a capture address and a release select terminal connected to receive a release address;
a release half-latch being connected between the intermediate node and a scan output node, having a control terminal connected to receive a clock signal; and
an update half-latch being connected between the intermediate node and a data output node, having a control terminal connected to receive a clock signal.

14. A scan latch according to claim 13 wherein the clock signals provided to the capture half-latches, release half-latch and update half-latch are different clock signals, the timing of which can be individually controlled.

15. A scan latch according to claim 13 wherein the clock signals provided to the capture half-latches, release half-latch and update half-latch are derived from a common clock source, the release half-latch and the update half-latch receiving the inverse of the common clock signal applied to the capture half-latches.

16. A scan latch according to claim 15 wherein the combination of one of the capture half-latches and one of either the update half-latch or the release half-latch acts as a positive edge triggered flip-flop.

17. A scan latch according to claim 15 or 16 wherein the release half-latch and the update half-latch each have a further control terminal connected to receive a control signal which determines whether that half-latch is in a data transfer state or a data holding state.

18. A scan latch according to claim 13 which comprises selection circuitry connected to the input of the capture half-latches and being responsive to a selection signal to select as the input signal to the capture half-latches one of a normal data signal and a scan data signal.

19. A scan latch according to claim 18 wherein the selection circuitry comprises a multiplexor.

20. A scan latch according to claim 13 when operated in a functional mode in which one of the capture half-latches is caused to store a normal data signal from the input node and one of the capture half-latches is caused to transfer a stored normal data signal to the intermediate node, the update half-latch being caused to transfer the normal data signal from the intermediate node to the data output terminal.

21. A scan latch according to claim 13 when operated in a shift mode in which one of the capture half-latches is caused to transfer a data signal from its input node to the intermediate node and then the release half-latch is caused to transfer the data signal from the intermediate node to the scan output terminal.

22. A scan latch according to claim 21 wherein the data signal is a scan data signal.

23. A scan latch according to claim 21 wherein the data signal is a normal data signal.

24. A scan latch according to claim 13 when operated in an update mode in which the update half-latch is caused to transfer the signal stored at the intermediate node to the data output terminal.

25. A method of operating a scan latch to perform a test of the functionality of a plurality of capture half-latches, said scan latch comprising a plurality of capture half-latches connected in parallel between an input node and an intermediate node and a release half-latch being connected between the intermediate node and a scan output node, the method comprising the steps of:
providing a predetermined sequence of scan test bits;
shifting the sequence of scan test bits through the scan latch from the input node to the scan output node; and
comparing the sequence of bits shifted out of the scan output node with the sequence of scan test bits shifted in;
wherein said shifting step includes the step of selecting each one of the plurality of capture half-latches in turn successively.

26. The method of claim 25 wherein the step of selecting each one of the plurality of capture half-latches in turn successively includes selecting a different capture half-latch in successive scan tests.

27. The method of claim 25 wherein the step of selecting each one of the plurality of capture half-latches in turn successively includes selecting a different capture half-latch in successive scan cycles of a scan test.

* * * * *